United States Patent
Chen et al.

(10) Patent No.: US 6,822,889 B2
(45) Date of Patent: Nov. 23, 2004

(54) READ ONLY MEMORY (ROM) AND METHOD FOR FORMING THE SAME

(75) Inventors: Ying-Tzuo Chen, Hsin-Chu (TW); Jung-Ren Hwang, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 51 days.

(21) Appl. No.: 10/419,781

(22) Filed: Apr. 22, 2003

(65) Prior Publication Data

US 2004/0213028 A1 Oct. 28, 2004

(51) Int. Cl.$^7$ .............................................. G11C 17/00
(52) U.S. Cl. .................................................... 365/94
(58) Field of Search .......................................... 365/94

(56) References Cited

U.S. PATENT DOCUMENTS 6,577,536 B1 * 6/2003 Chung et al. .......... 365/185.11

\* cited by examiner

Primary Examiner—Richard Elms
Assistant Examiner—Pho M. Luu
(74) Attorney, Agent, or Firm—Birch, Stewart, Kolasch & Birch, LLP

(57) ABSTRACT

A read only memory (ROM) and method for forming the same. A first programming method comprises adjusting threshold voltage of ROM cell by Vt implantation and oxidation. In this programming method, four-level ROM is obtained. The first ROM code with threshold voltage $Vt_1$ is performed with one Vt implantation and has a thin gate oxide layer. The second ROM code with threshold voltage $Vt_2$ is performed with two Vt implantations and has a thin gate oxide layer. The third ROM code with threshold voltage $Vt_3$ is performed with one Vt implantation and has a thick gate oxide layer. The fourth ROM code with threshold voltage $Vt_4$ is performed with two Vt implantations and has a thick gate oxide layer. A second programming method comprises connecting the ROM cell to or disconnecting it from bit line through contact window, such that two-level ROM without implant misalignment is obtained. Furthermore, the first and second programming methods can be combined, and each ROM cell has five ROM codes for selection.

11 Claims, 8 Drawing Sheets

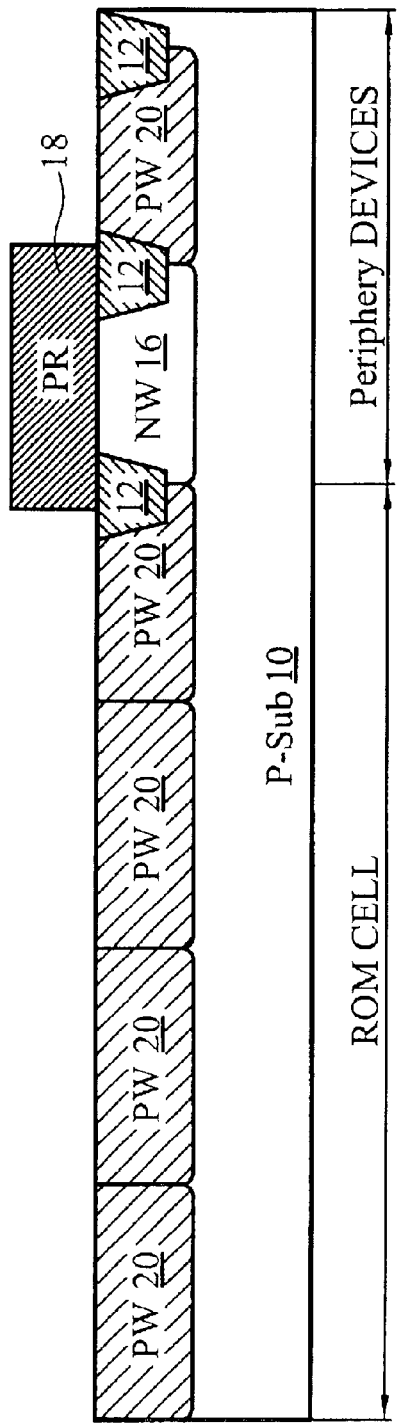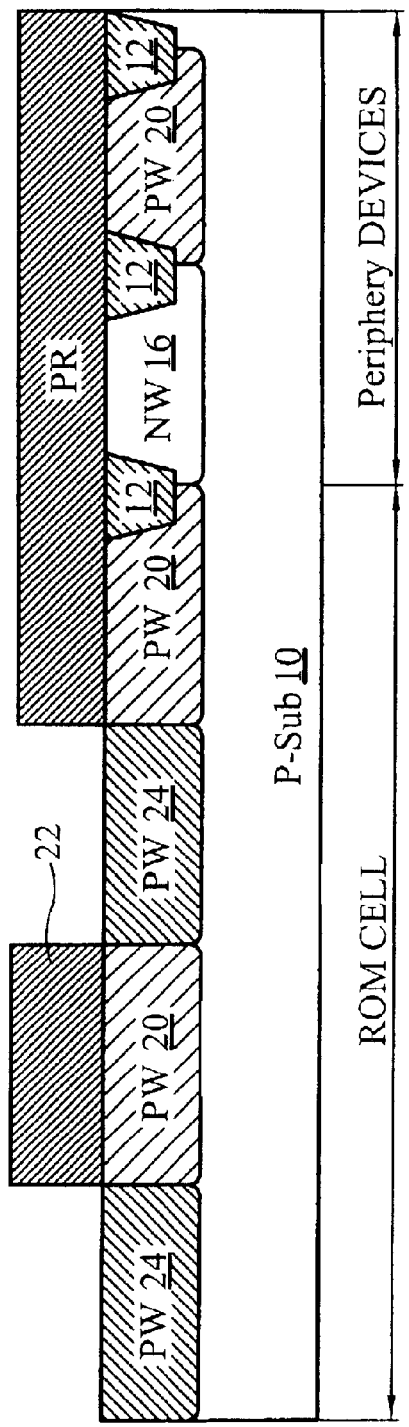

READ ONLY MEMORY (ROM) AND METHOD FOR FORMING THE SAME

BACKGROUND OF THE INVENTION

1. Field of the Invention

The present invention relates in general to a nonvolatile memory (NVM). In particular, the present invention relates to a multi-level read only memory (ROM) and method for producing the same.

2. Description of the Related Art

Mask ROM is generally made from a number of cell transistors, each serving as a memory unit. When programming is required, ions are implanted into the channel region of selected memory cells so that threshold voltage of these cells is modified, this step also being referred to as code implantation. The "on" or "off" state of each memory cell is thus set. The memory cell is formed in the word line (WL) covered area between two neighboring bit lines (BL). Each memory cell is capable of storing a binary bit of data, either in a logic state of "0" or "1" depending on whether the channel region of the memory cell is implanted or not.

However, when the generation of the mask ROM fabrication is migrated into deep-sub-micro semiconductor process, higher integration of the integrated circuit corresponds with smaller size of the semiconductor device. When ions are implanted into the channel region of selected memory cells, the implanting region may suffer from misalignment, shifting the threshold voltage of transistors. If the implanting region is misaligned, it may be shifted in the direction of word line or bit line, directly causing data storage error of the ROM cell and disturbing the neighboring implanting regions to affect operating properties of the memory cell, especially in the shift of word line direction.

In addition, in a high density MASK ROM (such as 32M, 64M or higher), the conventional two state MASK ROM takes up a large wafer area because of the larger chip size.

SUMMARY OF THE INVENTION

It is therefore an object of the present invention to provide a multi-level ROM coded by Vt implantation and oxidation.

Another object of the present invention is to provide a method for forming a multi-level ROM coded by Vt implantation and oxidation.

Still another object of the present invention is to provide a ROM layout which can be coded by contact via.

Still another object of the present invention is to provide a multi-level ROM layout which can be coded by contact via, Vt implantation and oxidation.

Still another object of the present invention is to provide an embedded ROM.

The present invention provides a multi-level ROM coded by Vt implantation and oxidation. Each ROM cell has four selections of ROM code. The first ROM code with threshold voltage $Vt_1$ is performed with one Vt implantation and has a thin gate oxide layer. The second ROM code with threshold voltage $Vt_2$ is performed with two Vt implantations and has a thin gate oxide layer. The third ROM code with threshold voltage $Vt_3$ is performed with one Vt implantation and has a thick gate oxide layer. The fourth ROM code with threshold voltage $Vt_4$ is performed with two Vt implantations and has a thick gate oxide layer.

The present invention provides a multi-level ROM with two thicknesses of gate oxide layer and two Vt adjusting recipes available for each ROM cell. Thus each ROM cell has four ROM codes for selection. The first ROM code is performed with first Vt adjusting recipe and has a thin gate oxide layer. The second ROM code is performed with second Vt adjusting recipe and has a thin gate oxide layer. The third ROM code is performed with first Vt adjusting recipe and has a thick gate oxide layer. The fourth ROM code is performed with second Vt adjusting recipe and has a thick gate oxide layer.

The present invention provides a method for forming a multi-level ROM, with two thicknesses of gate oxide layer and two Vt adjusting recipes are chosen for each ROM cell. After defining the active device region, well processes are performed. When forming well regions in the cell region, Vt adjusting recipes are also performed. The first Vt adjusting recipe is such as performing one Vt implantation, and the second Vt adjusting recipe is such as performing two Vt implantations. Then, two different thickness of gate oxide are performed. Thereby, the ROM cells are coded.

The present invention provides another programming method, in which the ROM cell is programmed by connecting or disconnecting to bit line through contact window. After forming transistors of a contact-ROM layout circuit, contact windows are formed in an insulating layer covering the transistors. Bit lines are formed on the insulating layer and the contact windows, and each transistor can connect or disconnect to bit line through the contact windows.

Furthermore, the first programming method of adjusting threshold voltage and the second programming method of connecting or disconnecting to bit line through contact window are combined, and each ROM cell has five ROM codes for selection. The first ROM code forms the first transistor with threshold voltage $Vt_1$ by performing the first Vt adjusting recipe and forming thin gate oxide layer. The second ROM code forms the second transistor with threshold voltage $Vt_2$ by performing second Vt adjusting recipe and forming thin gate oxide layer. The third ROM code forms the third transistor with threshold voltage $Vt_3$ by performing the first Vt adjusting recipe and forming thick gate oxide layer. The fourth ROM code forms the fourth transistor with threshold voltage $Vt_4$ by performing second Vt adjusting recipe and forming thick gate oxide layer. The fifth ROM code disconnects the transistor to bit line.

The method for forming the ROM with five ROM codes is simply described herein. After defining active device region, well processes are performed. When forming well regions in the cell region, Vt adjusting recipes are also performed. The first Vt adjusting recipe is such as performing one Vt implantation, and the second Vt adjusting recipe is such as performing two Vt implantations. Then, two different thickness of gate oxide are performed. These transistors then connect or disconnect to bit line through contact window, and the ROM cells are coded.

BRIEF DESCRIPTION OF THE DRAWINGS

The preferred embodiment of the invention is hereinafter described with reference to the accompanying drawings in which:

FIGS. 1A-1G are cross sections showing a method for forming a memory device having a four-level memory cell structure and programmed by a first programming method including Vt implantation and oxidation according to a first embodiment of this invention;

DETAILED DESCRIPTION OF THE INVENTION

Embodiment 1

A method for forming a memory device having a four-level memory cell structure and programmed by a first programming method including Vt implantation and oxidation is depicted in embodiment 1.

Figure 1A:
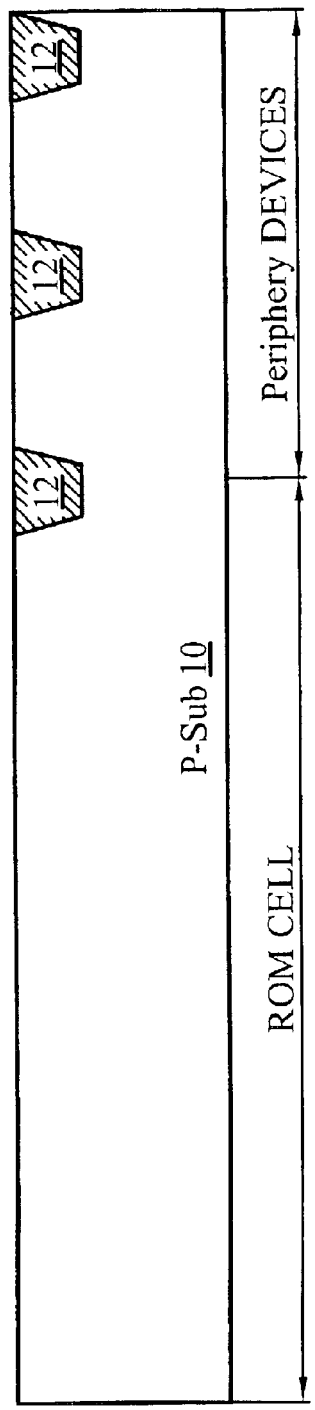

As shown in FIG. 1A, a semiconductor substrate 10, such as p-type silicon substrate, is provided. The semiconductor substrate 10 is partitioned into ROM cell region and periphery devices region. Isolation structures 12, such as shallow trench isolations (STIs), are formed in the semiconductor substrate 10 to define active regions.

Figure 1B:
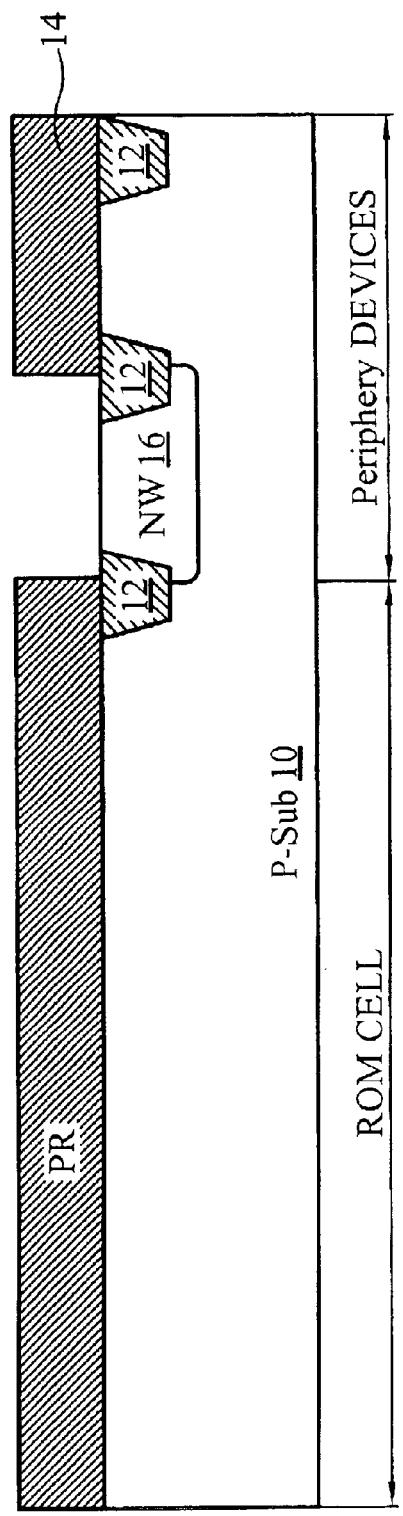

As shown in FIG. 1B, N-well 16 is formed in semiconductor substrate 10 using photoresist layer 14 as an implantation mask. The photoresist layer 14 is then removed.

As shown in FIG. 1C, P-well 20 is formed in semiconductor substrate 10 using photoresist layer 18 as an implantation mask. When forming the P-well 20, first Vt implantation is performed to adjust threshold voltage. The photoresist layer 18 is then removed.

As shown in FIG. 1D, cell Vt implantation is performed to adjust threshold voltage in the one portion of the ROM cell region, marked as 24, using photoresist layer 22 as an implantation mask. The photoresist layer 22 is then removed.

Therefore, one Vt implantation is performed for P-well 20 and two Vt implantations are performed for P-well 24.

Figure 1E:
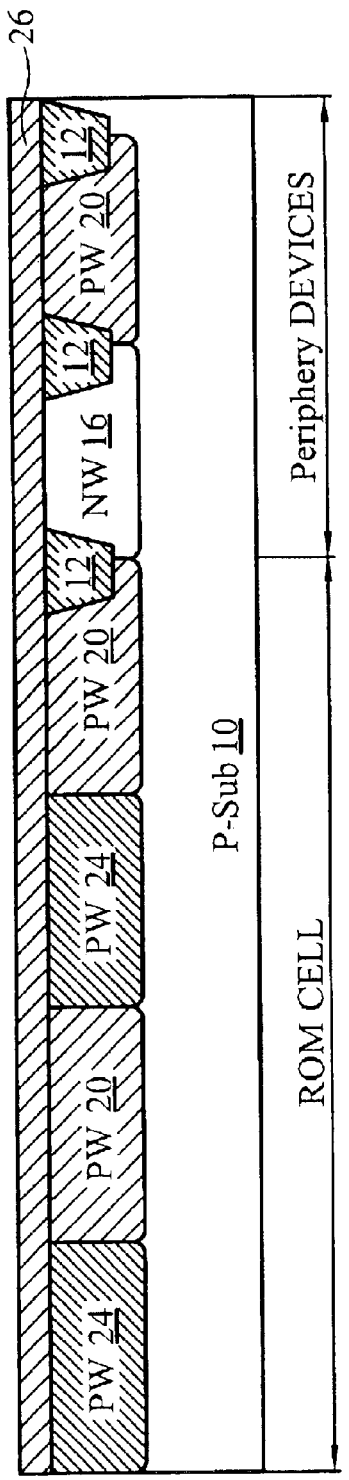

As shown in FIG. 1E, first gate oxide layer 26, such as 70 in thickness, is formed on the whole semiconductor substrate 10. The first gate oxide layer 26 is formed by oxidation.

Figure 1F:
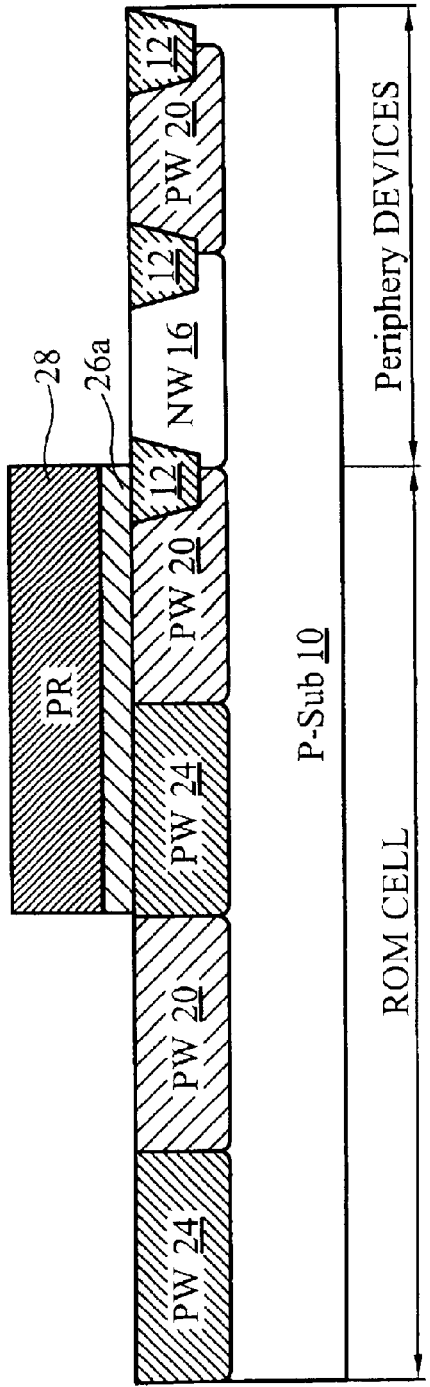

As shown in FIG. 1F, the first gate oxide layer 26 is patterned using photoresist layer 28 as an etching mask. A patterned first gate oxide layer 26a is therefore formed. The photoresist layer 28 is then removed.

Figure 1G:
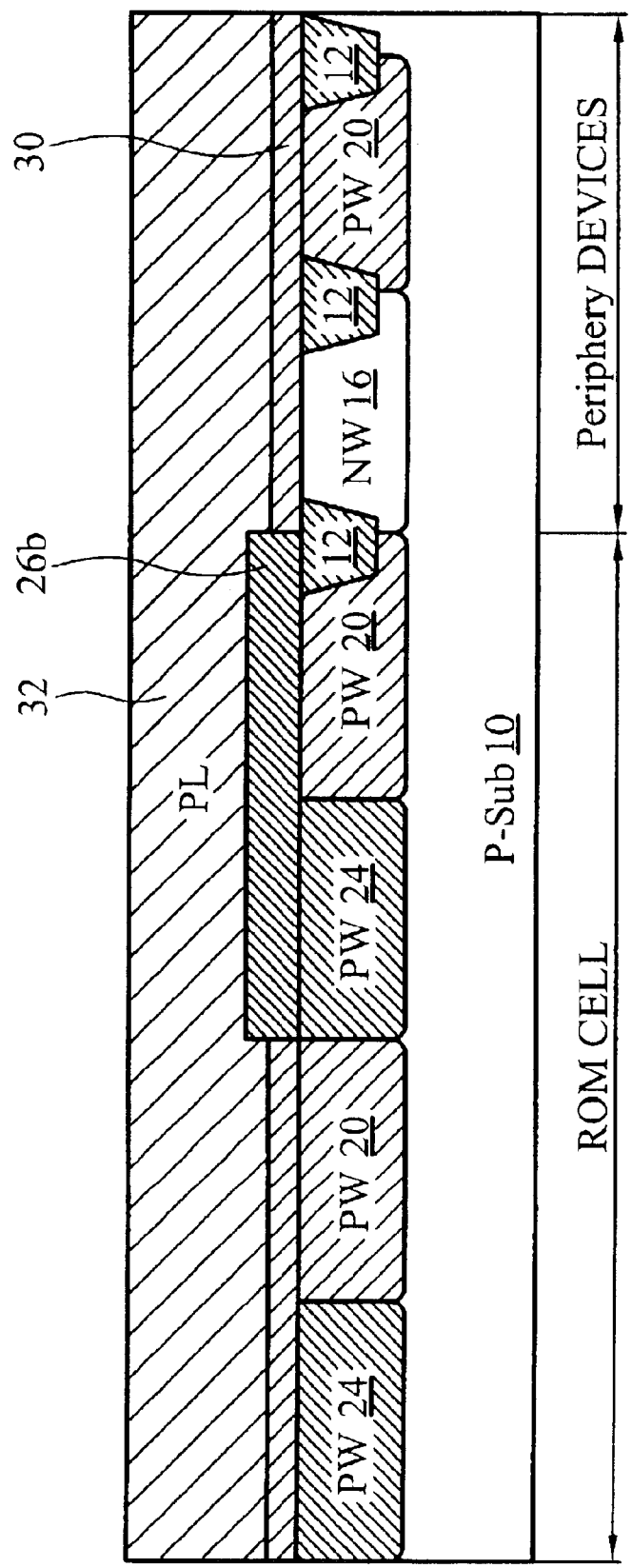

As shown in FIG. 1G, second gate oxide layer 30, such as 50 in thickness, is formed on the surface of the semiconductor substrate 10 by oxidation. The thickness of the patterned first gate oxide layer 26a is also partially increased and the first gate oxide layer is therefore marked as 26b.

A control gate 32, such as 2500 in thickness, is formed on the first gate oxide layer 26b and the second oxide layer 30. The control gate 32 is such as polysilicon layer formed by chemical vapor deposition (CVD).

The process is similar to traditional CMOS process, and can be used to fabricate embedded ROM. Compared to traditional ROM process, there is no bit line to bit line leakage issue.

Figure 2:
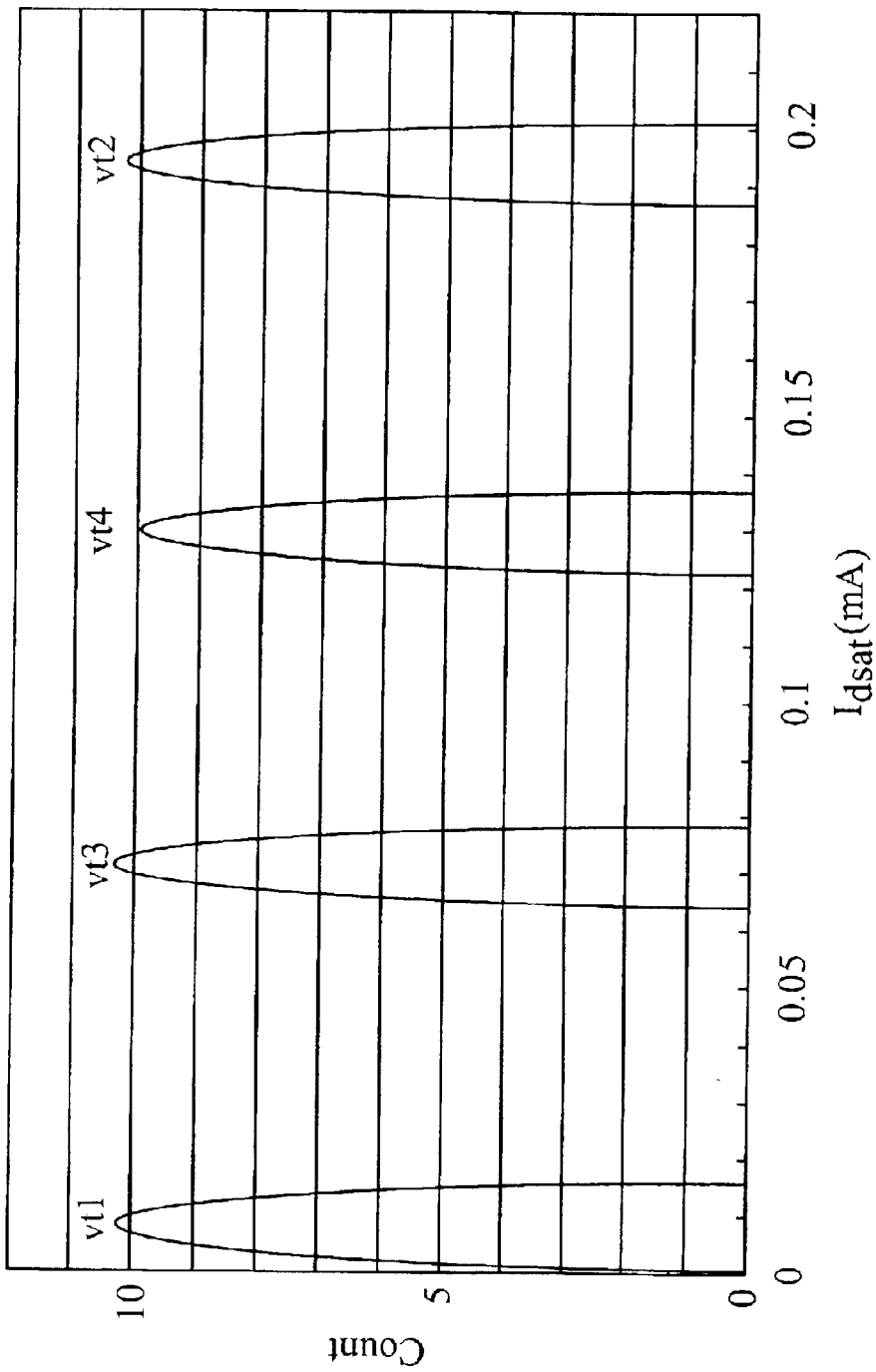
FIG. 2 is a specific example of four ROM cells with four ROM codes with different read currents (Idsat)

As mentioned above, there are thus four kinds of ROM code with different threshold voltages, as shown in Table 1. The first ROM code with threshold voltage $Vt_1$ is performed with one Vt implantation and has a thin gate oxide layer 30. The second ROM code with threshold voltage $Vt_2$ is performed with two Vt implantations and has a thin gate oxide layer 30. The third ROM code with threshold voltage $Vt_3$ is performed with one Vt implantation and has a thick gate oxide layer 26b. The fourth ROM code with threshold voltage $Vt_4$ is performed with two Vt implantations and has a thick gate oxide layer 26b. Each ROM cell has four selective codes as mentioned above to record. These four ROM codes can be discriminated by read current. FIG. 2 is a specific example of four ROM cells with four ROM codes with different read currents (Idsat). For example, for the NMOS with W/L=0.3/0.24, the cells coded with threshold voltages $Vt_1$, $Vt_2$, $Vt_3$ and $Vt_4$ have read current of about 0–0.016, 0.063–0.078, 0.122–0.137 and 0.187–0.201, respectively. Thus, a multi-level cell is achieved.

TABLE 1

|  | Thin gate oxide (30) | Thick gate oxide (26b) |
| --- | --- | --- |
| One Vt implantation | $Vt_1$ | $Vt_3$ |
| Two Vt implantations | $Vt_2$ | $Vt_4$ |

Figure 3:
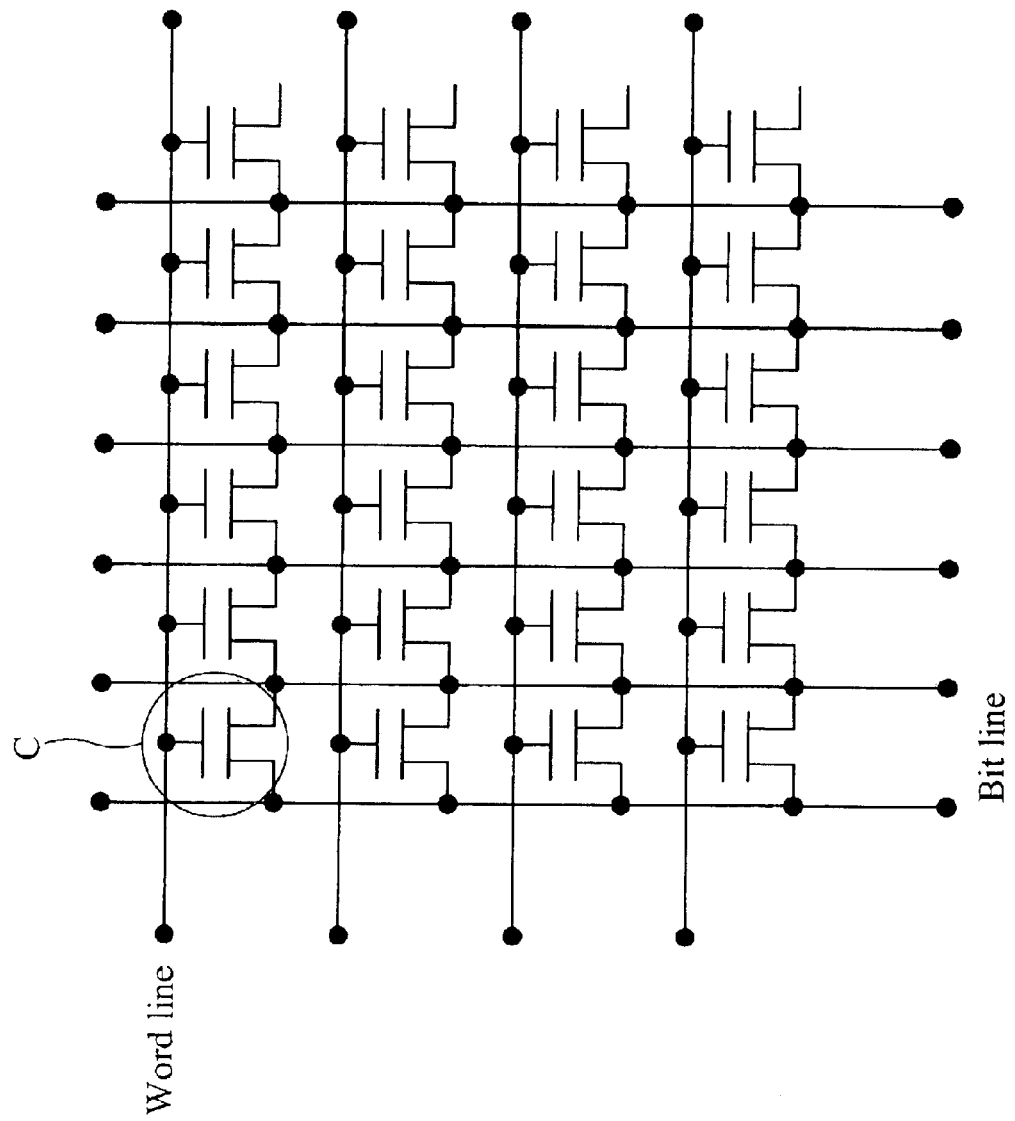
FIG. 3 is a traditional ROM layout circuit.
Figure 4:
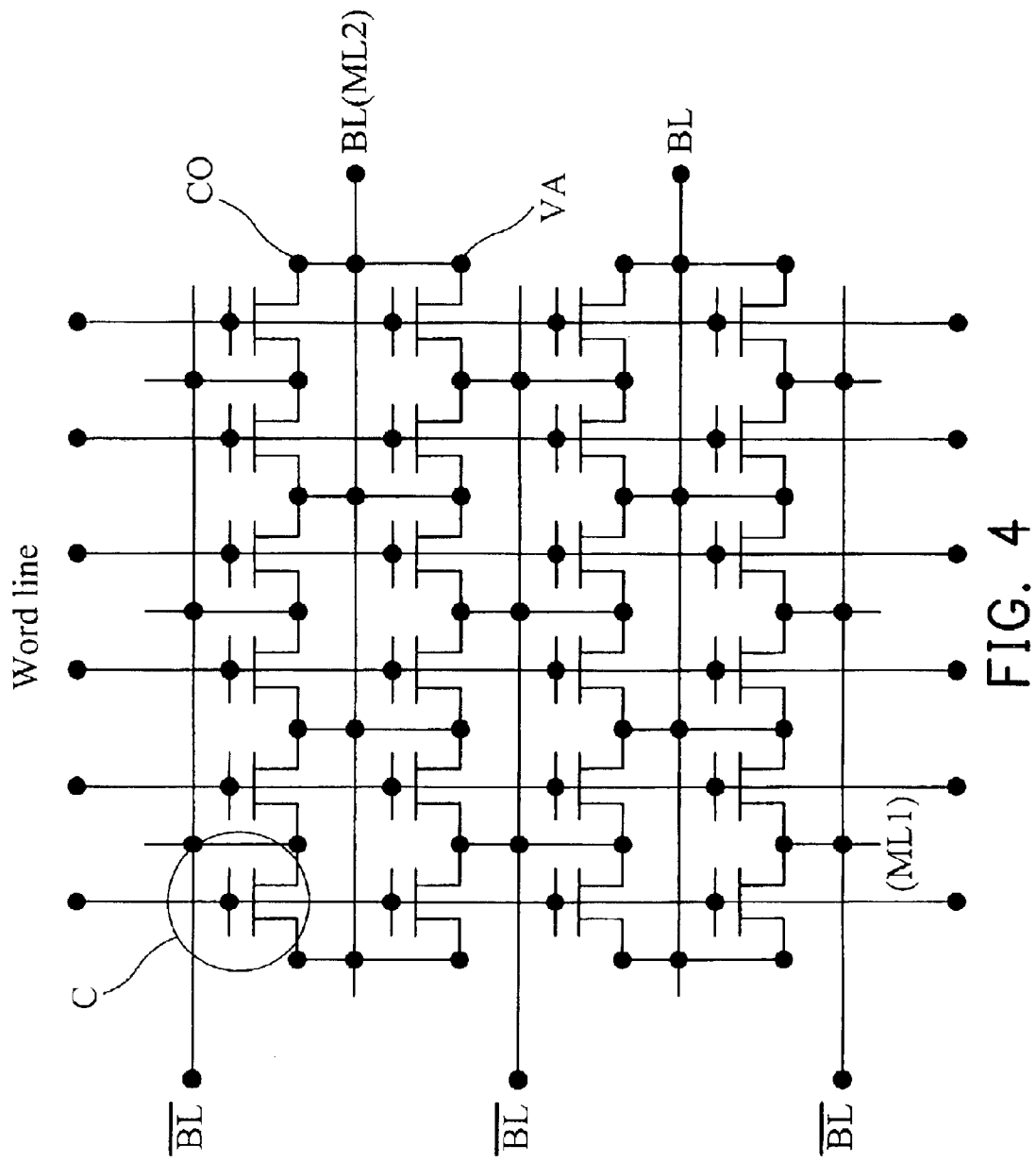
FIG. 4 is a ROM layout circuit suitable for the four-level memory cell structure of the present invention.

These four ROM codes can be used in the traditional ROM layout circuit as shown in FIG. 3 or another new ROM layout circuit as shown in FIG. 4. Each ROM cell C has four selective codes as mentioned above.

As for the traditional ROM layout circuit shown in FIG. 3, the transistors C displaced in the same row are controlled by one word line, and the sources and drains of the transistors C displaced in the same column are controlled by two bit lines respectively.

As for another ROM layout circuit as shown in FIG. 4, each transistor C includes a control gate connecting to word line and a first and second electrodes functioning as source and drain or vice versa. The transistors C displaced in the same column are controlled by one word line, the first electrodes of the transistors C displaced in two adjacent rows are controlled by one bit line, and the second electrodes of the transistors C displaced in upper and lower row are controlled by two bit lines, respectively.

For specific example, the bit lines are formed on a second metal layer (ML2), and conducting lines connecting the first and second electrodes of the transistors C to the bitlines BL and bit line bars BL are formed on a first metal layer (ML1). In such situation, points, as shown in figure, on the first and second electrodes connecting to the conducting lines are referred as contact plugs (CO), and points on the conducting lines connecting to the bit lines BL are referred as via plugs (VA).

Embodiment 2

In this embodiment, a two-level ROM with a second programming method replaces the traditional programming method of implanting ions into the channel region of selected memory cells. Therefore, problems from misalignment of the implanting region are resolved.

A second programming method of contacting code is provided, and the transistors, memory cells, connecting to bit line are referred to as "ON" or in logic "1" state and disconnecting therefrom are referred to as "OFF" or in logic "0" state.

Figure 5:
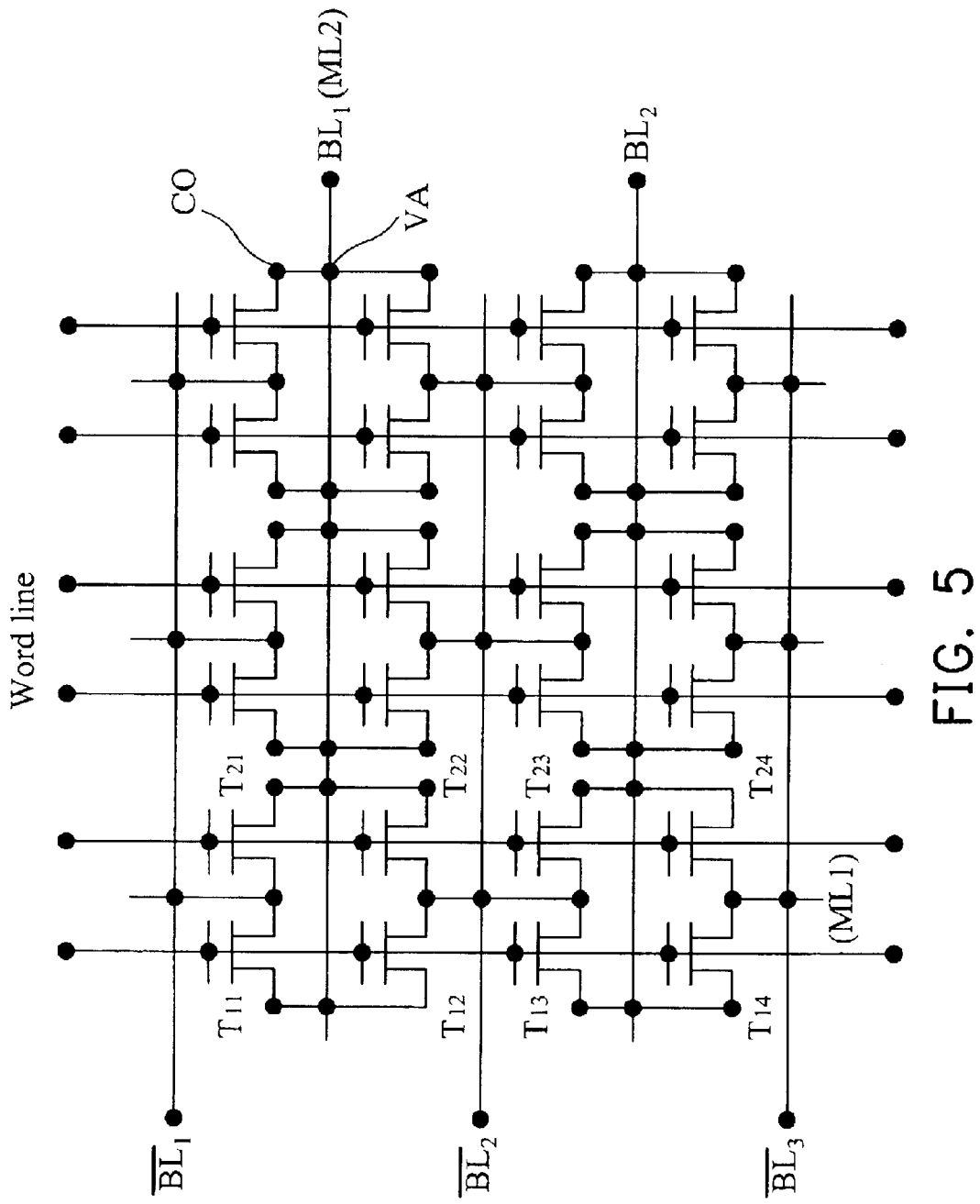
FIG. 5 is a contact-ROM layout circuit of the present invention.

A contact-ROM layout circuit suitable for the contacting code is shown in FIG. 5.

After forming transistors disposed as shown in FIG. 5, contact windows are formed in an insulating layer covering the transistors. Bit lines are formed on the insulating layer and the contact windows, and each transistor can connect or disconnect to bit line through the contact windows. Therefore, each ROM cell is programmed by connecting or disconnecting to bit line through contact window.

As for the contact-ROM layout circuit shown in FIG. 5, each repeating unit comprises four transistors, such as $T_{11}$, $T_{12}$, $T_{21}$, $T_{22}$, the second electrode (i.e. common source) of transistors $T_{11}$ and $T_{21}$ connects to bit line bar $BL_1$, the second electrode (i.e. common source) of transistors $T_{12}$ and $T_{22}$ connects to bit line bar $BL_2$, and each first electrode (i.e. drain) of the four transistors can connect to bit line $BL_1$ through contact windows.

Each transistor is coded by connecting to the bit line $BL_1$ or not. For example, transistors $T_{11}$, $T_{21}$, $T_{22}$ connect to the bit line $BL_1$ through corresponding contact windows, and transistor $T_{12}$ does not connect to the bit line $BL_1$. Therefore, transistors $T_{11}$, $T_{12}$, $T_{21}$, $T_{22}$ record logic states of (1, 0, 1, 1).

For specific example, the bit lines $BL_1$ and $BL_2$ and bit line bars $BL_1$, $BL_2$ and $BL_3$ are formed on a second metal layer (ML2), and conducting lines connecting the first and second electrodes of the transistors C to the bitlines $BL_1$ and $BL_2$ and bit line bars $BL_1$, $BL_2$ and $BL_3$ are formed on a first metal layer (ML1). In such situation, points, as shown in figure, on the first and second electrodes connecting to the conducting lines are referred as contact plugs (CO), and points on the conducting lines connecting to the bit lines or bit line bars are referred as via plugs (VA).

Embodiment 3

The programming method in embodiments 1 and 2 can be combined to produce a five-level ROM. A detailed description of the five-level ROM is given hereafter, with FIG. 5.

Each transistor of the contact-ROM layout circuit can be coded by changing threshold voltage as described in embodiment 1 or contacting the bit line or not as described in embodiment 2.

Therefore, there are five ROM codes available for each ROM cell, that is, transistor. The first ROM code forms the first transistor with threshold voltage Vt1, the second ROM code forms the second transistor with threshold voltage Vt2, the third ROM code forms the third transistor with threshold voltage Vt3, and the fourth ROM code forms the fourth transistor with threshold voltage Vt4, and the fifth ROM code disconnects the transistor to bit line. These five ROM codes can be discriminated by read current. Thus, a multi-level cell is achieved.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A read only memory (ROM), comprising:
   a first ROM code with a first threshold voltage formed with a first Vt adjusting recipe and a thin gate oxide layer;
   a second ROM code with a second threshold voltage formed with a second Vt adjusting recipe and the thin gate oxide layer;
   a third ROM code with a third threshold voltage formed with the first Vt adjusting recipe and a thick gate oxide layer; and
   a fourth ROM code with a fourth threshold voltage formed with the second Vt adjusting recipe and the thick gate oxide layer.

2. The ROM of claim 1, wherein the first Vt adjusting recipe performs one Vt implantation and the second Vt adjusting recipe performs two Vt implantations.

3. The ROM of claim 1, further comprising:
   a first ROM cell having a first gate electrode, a first electrode and a second electrode;
   a second ROM cell having a second gate electrode, a third electrode and a fourth electrode;
   a third ROM cell having a third gate electrode, a fifth electrode and a sixth electrode;
   a fourth ROM cell having a fourth gate electrode, a seventh electrode and a eighth electrode;
   a first word line connecting the first gate electrode and the second gate electrode;
   a second word line connecting the third gate electrode and the fourth gate electrode;
   a first bit line connecting the first electrode and the fifth electrode;
   a second bit line connecting the second electrode, the third electrode, the sixth electrode and the seventh electrode; and
   a third bit line connecting the fourth electrode and the eighth electrode,
   wherein each of the first, second, third and fourth ROM cells has one of the first, second, third and fourth ROM codes.

4. The ROM of claim 1, further comprising:
   a first ROM cell having a first gate electrode, a first electrode and a second electrode;
   a second ROM cell having a second gate electrode, a third electrode and a fourth electrode;
   a third ROM cell having a third gate electrode, a fifth electrode and a sixth electrode;
   a fourth ROM cell having a fourth gate electrode, a seventh electrode and a eighth electrode;
   a first word line connecting the first gate electrode and the third gate electrode;
   a second word line connecting the second gate electrode and the fourth gate electrode;
   a first bit line connecting the second electrode and the third electrode;
   a second bit line connecting the first electrode, the fifth electrode, the fourth electrode and the eighth electrode; and
   a third bit line connecting the sixth electrode and the seventh electrode,
   wherein each of the first, second, third and fourth ROM cells has one of the first, second, third and fourth ROM codes.

5. A method for forming read only memory (ROM), comprising:
   providing a substrate having a ROM cell region;
   forming a well region in the ROM cell region, wherein the well region is divided into a first well region and a second well region;
   adjusting threshold voltage with a first Vt adjusting recipe in the first well region;
   adjusting threshold voltage with a second Vt adjusting recipe in the second well region;
   forming a first gate oxide layer with first thickness on one part of the first well region and one part of the second well region; and forming a second gate oxide layer with second thickness on another part of the first well region and another part of the second well region.

6. The method of claim 5, wherein the first Vt adjusting recipe performs one Vt implantation and the second Vt adjusting recipe performs two Vt implantations.

7. A read only memory (ROM), comprising:
a first ROM cell having a first gate electrode, a first electrode and a second electrode;
a second ROM cell having a second gate electrode, a third electrode and a fourth electrode;
a third ROM cell having a third gate electrode, a fifth electrode and a sixth electrode;
a fourth ROM cell having a fourth gate electrode, a seventh electrode and a eighth electrode;
a first word line connecting the first gate electrode and the third gate electrode;
a second word line connecting the second gate electrode and the fourth gate electrode;
a first bit line bar connecting the second electrode and the third electrode;
a second bit line bar connecting the sixth electrode and the seventh electrode; and
a first bit line,
wherein each of the first electrode, the fifth electrode, the fourth electrode and the eighth electrode connects to or disconnects from the first bit line through corresponding contact window.

8. The ROM of claim 7, wherein each of the first, second, third and fourth ROM cells has one of the following codes:
a first ROM code with a first threshold voltage formed with a first Vt adjusting recipe and a thin gate oxide layer;
a second ROM code with a second threshold voltage formed with a second Vt adjusting recipe and the thin gate oxide layer;
a third ROM code with a third threshold voltage formed with the first Vt adjusting recipe and a thick gate oxide layer; and
a fourth ROM code with a fourth threshold voltage formed with the second Vt adjusting recipe and the thick gate oxide layer.

9. The ROM of claim 8, wherein the first Vt adjusting recipe performs one Vt implantation and the second Vt adjusting recipe performs two Vt implantations.

10. A method for forming read only memory (ROM), comprising:
providing a substrate having a ROM cell region;
forming a well region in the ROM cell region, wherein the well region is divided into a first well region and a second well region;
adjusting threshold voltage with a first Vt adjusting recipe in the first well region;
adjusting threshold voltage with a second Vt adjusting recipe in the second well region;
forming a first gate oxide layer with first thickness on one part of the first well region and one part of the second well region;
forming a second gate oxide layer with second thickness on another part of the first well region and another part of the second well region;
forming a control gate layer on the first gate oxide layer and the second gate oxide layer so as to form four kinds of transistors with different threshold voltages;
forming an insulating layer covering the control gate;
forming a plurality of contact windows in the insulating layer; and
forming a bit line on the insulating layer and the contact windows,
wherein each transistor is programmed by connecting or disconnecting to the bit line through the contact window.

11. The method of claim 10, wherein the first Vt adjusting recipe performs one Vt implantation and the second Vt adjusting recipe performs two Vt implantations.

* * * * *